(12) United States Patent
Rhoades et al.

(10) Patent No.: US 6,365,520 B1
(45) Date of Patent: Apr. 2, 2002

(54) SMALL PARTICLE SIZE CHEMICAL MECHANICAL POLISHING COMPOSITION

(75) Inventors: Robert L. Rhoades, Matthews; Robert C. Roberts, Mint Hill; Paul J. Yancey, Charlotte, all of NC (US)

(73) Assignee: Rodel Holdings Inc., Wilmington, DE (US)

( * ) Notice: Subject to any disclaimer, the term of this patent is extended or adjusted under 35 U.S.C. 154(b) by 0 days.

(21) Appl. No.: 09/620,150

(22) Filed: Jul. 20, 2000

Related U.S. Application Data

(62) Division of application No. 09/252,279, filed on Feb. 18, 1999.
(60) Provisional application No. 60/075,015, filed on Feb. 18, 1998.

(51) Int. Cl.[7] .............................................. H01L 21/302
(52) U.S. Cl. ...................... 438/690; 438/691; 438/692; 438/693; 438/697
(58) Field of Search .................. 438/690, 691, 438/692, 693, 745, 697

(56) References Cited

U.S. PATENT DOCUMENTS

| 5,264,010 A | 11/1993 | Brancaleoni et al. |
| 5,525,191 A | 6/1996 | Maniar et al. |
| 5,527,423 A | 6/1996 | Neville et al. |
| 5,607,718 A | 3/1997 | Sasaki et al. |
| 5,626,715 A | 5/1997 | Rostoker |
| 5,645,736 A | 7/1997 | Allman |
| 5,652,177 A | 7/1997 | Pan |
| 5,664,990 A | 9/1997 | Adams et al. |
| 5,800,577 A | * 9/1998 | Kido ........................... 51/307 |
| 5,827,781 A | * 10/1998 | Skrovan et al. ............. 438/692 |
| 5,891,205 A | * 4/1999 | Picardi et al. ................ 51/308 |

FOREIGN PATENT DOCUMENTS

| EP | 0874036 | 10/1998 |
| EP | 0899005 | 3/1999 |

* cited by examiner

Primary Examiner—Benjamin L. Utech
Assistant Examiner—Binh X. Tran
(74) Attorney, Agent, or Firm—Konrad Kaeding; Gerald K. Kita; Kenneth A. Benson

(57) ABSTRACT

The present invention provides a chemical mechanical polishing slurry for the planarization of shallow trench isolation structures and other integrated circuit structures. The chemical mechanical polishing slurry of this invention comprises small abrasive particles having a mean diameter of between about 2 and 30 nm and large abrasive particles having a mean diameter of between 2 and 10 times larger than the mean diameter of the small abrasive particles. In use, the chemical mechanical polishing slurry of this invention can also include viscosity additives and etchants.

9 Claims, 2 Drawing Sheets

SMALL PARTICLE SIZE CHEMICAL MECHANICAL POLISHING COMPOSITION

This divisional application claims the benefit of U.S. Utility patent application Ser. No. 09/252,279 filed Feb. 18, 1999 which claims the benefit of U.S. Provisional Patent Application No. 60/075,015 filed Feb. 18, 1998.

BACKGROUND OF THE INVENTION

1. Field of the Invention

The present invention is directed to chemical mechanical polishing (CMP) compositions and more particularly to CMP compositions for planarizing shallow trench isolation structures or similar structures for integrated circuits.

2. Discussion of Related Art

The wide spread use of integrated circuits, also known as "chips", in numerous applications is well known. Typically, integrated circuits are prepared by patterning regions in a substrate such as a silicon or gallium arsenide wafer and patterning layers on the substrate. For example, insulating, conductive and/or semiconductor regions can be patterned in the substrate to produce devices such as transistors, diodes and capacitors.

One method of forming insulating regions in silicon wafers is known as LOCOS (local oxidation of silicon). This method typically involves depositing a silicon nitride layer on the silicon wafer, selectively etching the silicon nitride to expose selected regions of the silicon wafer, and oxidizing the exposed silicon to grow silicon dioxide in the exposed areas. One problem with this method is that silicon dioxide is not only produced in the exposed silicon areas, but also tends to grow laterally under the edges of the silicon nitride layer. Specifically, the silicon dioxide forms "bird's beaks" which project into the silicon wafer underlying the silicon nitride. These bird's beaks negatively affect the operation of the resulting transistor device. Moreover, as the distance between patterned devices continues to decrease in the design of integrated circuits, these bird's beaks could actually connect underneath the silicon nitride layer. As a result, the function of the resulting transistor device could be destroyed.

One alternative to LOCOS is referred to as shallow trench isolation. The shallow trench isolation method does not suffer from the problem of bird's beak formation and thus can be used in small structures. This method typically comprises growing a thin protective silicon dioxide layer, depositing a silicon nitride layer, depositing and patterning a photoresist layer, etching through the exposed areas of the silicon nitride layer and the underlying silicon dioxide into the silicon substrate to a controlled depth, stripping the photoresist layer, depositing a trench fill silicon dioxide, and chemical mechanical polishing the excess trench fill silicon dioxide to expose the covered silicon nitride layer. It is desirable for the thickness of the nitride layer to be consistent across the wafer regardless of the feature size or density in order to achieve consistent performance of the finished devices. Following CMP, the now exposed nitride is stripped leaving regions of silicon for the formation of active devices with insulating trenches formed therebetween.

In the chemical mechanical polishing of these patterned substrates, the local polish rate is known to be dependent on the feature size and the local pattern density. Small isolated structures are removed much more quickly than large structures or densely packed small structures. For this reason, in order to produce a planarized integrated circuit structure, there is a narrow process window, i.e., a small range, of effective polishing times. As a result, it is difficult to produce integrated circuit structures without having some regions which are under-polished and/or over-polished by the CMP process. Under-polishing is characterized by incomplete removal of the silicon dioxide overlying the silicon nitride and prevents the silicon nitride from being properly etched in later process steps. Over-polishing is characterized by the complete removal of the silicon nitride at certain locations and subsequent damage to the silicon wafer at these locations. Both under-polishing and over-polishing result in poor device performance.

One type of CMP slurry currently used in shallow trench isolation methods has high selectivity such that the silicon dioxide is removed by the slurry at a much faster rate than the underlying silicon nitride. These slurries have proven to be effective in removing a blanket silicon dioxide layer deposited over a blanket silicon nitride layer without significantly polishing the silicon nitride layer. However, there is a significant difference between polishing blanket films and patterned wafers. Specifically, the selectivity of the slurry to nitride is significantly different on patterned wafers due to the concentration of force on small isolated features during the CMP process. As a result, these small isolated features are prone to being over-polished even though other features on the same wafer can be at the desired level or even under-polished. Therefore, it is difficult to produce a patterned substrate having uniform silicon nitride thicknesses over the surface of the substrate.

SUMMARY OF THE INVENTION

The present invention provides a CMP composition (slurry) for planarization of integrated structures without under-polishing or over-polishing the materials used in forming these structures. The CMP slurries of this invention effectively planarize raised structures but polish planar structures at a considerably slower rate to prevent over-polishing of these structures. When used for planarization of an integrated structure, the CMP slurry of this invention produces a silicon nitride layer having uniform thickness across the structure thereby maximizing the performance of the corresponding integrated circuit.

Although the description which follows is particularly related to the use of the CMP slurry of this invention for the planarization of shallow trench isolation structures, the CMP slurry may also be used for any metal interconnect structure such as a metal damascene structure comprising a conductive metal (such as Cu, Al, W, Pt, Pd, Au, or any combination or alloy thereof), a barrier or liner layer (such as Ta, TaN, Ti, TiN, TiW, or any combination thereof), and an underlying ILD structure (such as PSG, BPSG, $SiO_2$, or any low-K material).

The CMP slurry of this invention comprises small abrasive particles having a mean diameter of between about 2 and 30 nm and large abrasive particles having a mean diameter between 2 and 10 times larger than the mean diameter of the small abrasive particles. Preferably, the large abrasive particles have a mean diameter between about 30 and 100 nm. The small and large abrasive particles are typically silica particles but could be alumina, titania, ceria, germania, silicon carbide, diamond and the like. Preferably, the volume ratio of small abrasive particles to large abrasive particles is between 5:1 and 100:1, and more preferably between 5:1 and 20:1. In addition, the CMP slurry may also contain viscosity additives such as thickening agents, etchants, and other additives (other large abrasive particles). The CMP slurry preferably has a viscosity between about 50 and 500 centipoise.

DETAILED DESCRIPTION OF THE INVENTION

Figure 1:
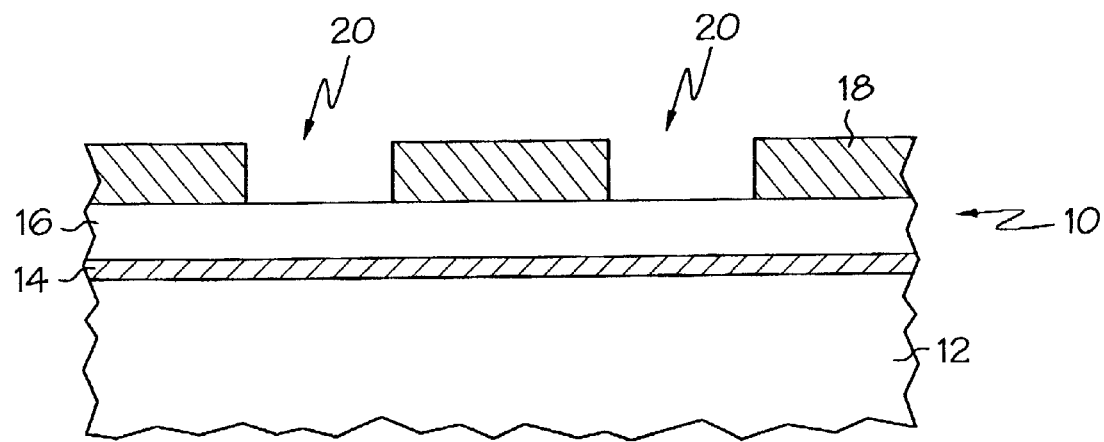
FIG. 1 is a side cross-sectional view of a multilevel integrated circuit structure prior to etching.

In the drawings and the following detailed description, preferred embodiments are described in detail to enable practice of the invention. Although the invention is described with reference to these specific preferred embodiments, it will be understood that the invention is not limited to these preferred embodiments. But to the contrary, the invention includes numerous alternatives, modifications and equivalents as will become apparent from consideration of the following detailed description and accompanying drawings. In the drawings, like numbers refer to like elements throughout.

FIG. 1 illustrates an integrated circuit structure 10. The integrated circuit structure 10 comprises a substrate 12 such as a silicon or gallium arsenide wafer. A thin insulating layer 14 such as a silicon dioxide layer is deposited onto the substrate 12 as a sacrificial layer to protect the substrate during later processing steps. The thin insulating layer 14 is applied by suitable deposition techniques to a thickness of between 100 Å and 250 Å. A silicon nitride (SiN) stop layer 16 is also deposited by suitable deposition techniques onto the thin insulating layer 14 to a thickness of between 500 Å and 3000 Å. Alternatively, other suitable stop layers can be used in accordance with the invention.

Once the stop layer 16 is deposited, the substrate is prepared for photolithographic patterning to produce patterned regions in the substrate and devices in the integrated circuit structure 10. In the integrated circuit structure 10 of FIG. 1, a photoresist layer 18 is applied to the stop layer 16 in a pattern such that trenches 20 are present in the photoresist layer. As will be understood to those skilled in the art, other patterns can also be provided by selectively applying the photoresist layer 18 to the stop layer 16. Once the photoresist layer 18 is applied, the integrated circuit structure 10 can be etched by a suitable method to remove the material not protected by the photoresist layer. Typically, during the etching of the integrated circuit structure 10, a portion of the stop layer 16, the sacrificial layer 14 and the underlying substrate 12 are removed to produce a pattern in the integrated circuit structure. The photoresist layer 18 is then stripped by a suitable method.

Figure 2:
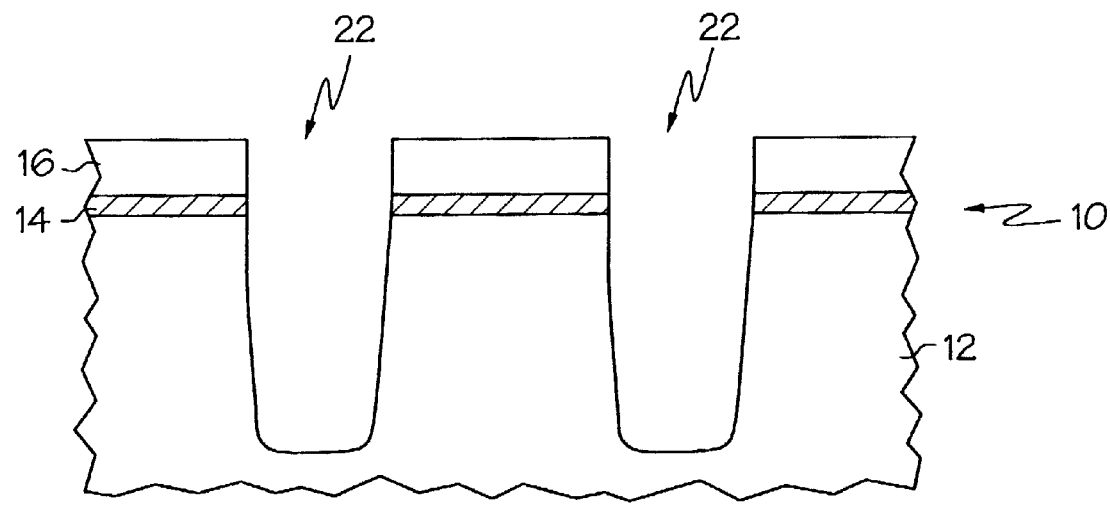
FIG. 2 is a side cross-sectional view of the integrated circuit structure of FIG. 1 after etching.
Figure 3:
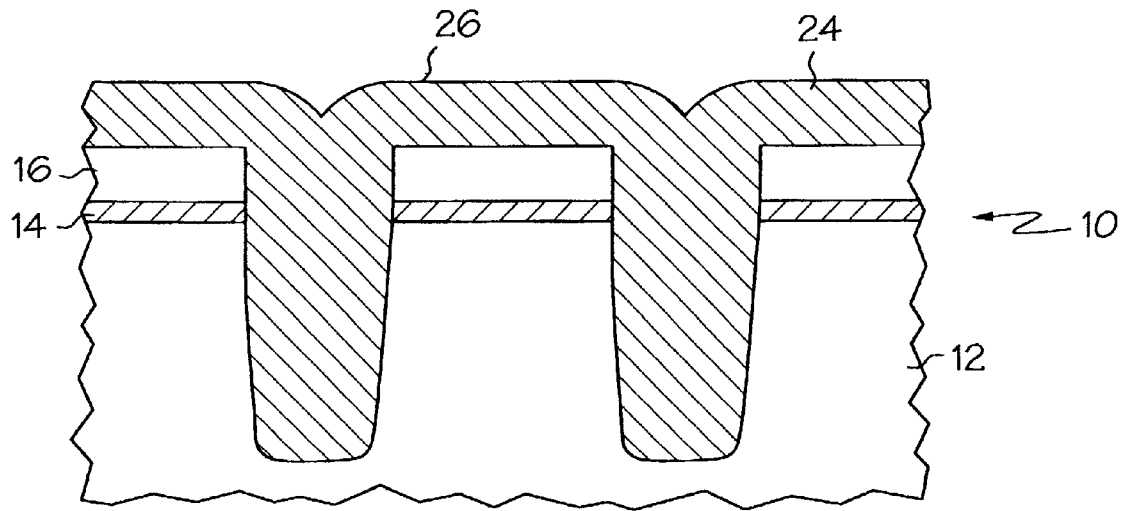
FIG. 3 is a side cross-sectional view of the integrated circuit structure of FIG. 2 after the deposition of a blanket film of an insulating material.
Figure 4:
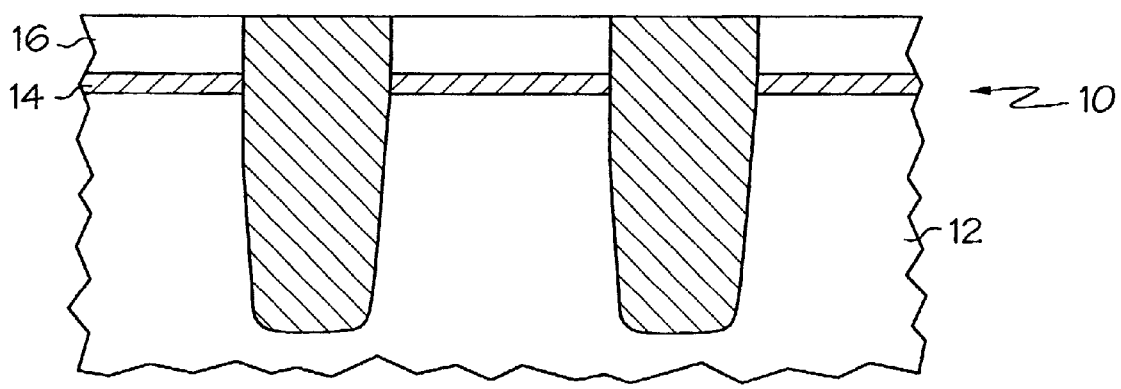
FIG. 4 is a side cross-sectional view of the integrated circuit structure of FIG. 3 after chemical mechanical polishing with the slurry of this invention.

FIG. 2 illustrates the integrated circuit structure 10 after the structure has been etched and the photoresist layer 18 has been stripped. As illustrated in FIG. 2, the resulting integrated circuit structure 10 contains shallow trenches 22. Once the trenches 22 have been etched into the integrated circuit structure 10, the trenches are filled with a suitable material depending on the device being formed in the trench. Typically, the trenches 22 are filled by applying a blanket film 24 of material over the substrate 10 as illustrated in FIG. 3. The blanket film 24 can be deposited by various methods known in the art. Preferably, in the practice of the present invention, a blanket film 24 of silicon dioxide is deposited to fill the trenches 22 for the purpose of providing electrical isolation between transistor devices.

Once the blanket film 24 has been applied, the structure 10 is planarized using a chemical mechanical polishing (CMP) process. As is well known to those skilled in the art, the CMP process involves holding or rotating a semiconductor wafer against a rotating polishing surface 26 under a controlled downward pressure. A chemical mechanical polishing slurry is used to wet the polishing surface 26 and contains an abrasive to facilitate mechanical polishing of the integrated circuit structure 10. The chemical mechanical polishing process is continued until the structure 10 is effectively planarized. The stop layer 16 can then be removed such as through the use of a wet etchant (e.g. hot phosphoric acid) and/or additional devices and layers can be patterned on the polished integrated circuit structure.

The chemical mechanical polishing slurries of this invention include small abrasive particles having a mean diameter of between about 2 and 30 nm. Suitable abrasive particles include silica, alumina, titania ($TiO_2$), diamond, ceria ($CeO_2$), germania ($GeO_2$), silicon carbide and the like. In this invention, the small abrasive particles are preferably silica particles. The small abrasive particles used in the CMP slurry can be fumed or precipitated, and are preferably provided in an aqueous dispersion. The term "dispersion" as used herein refers to suspensions, colloidal dispersions (also known as colloidal solutions or sols), and other particulate dispersions. Exemplary silica dispersions for use in the invention are the KLEBOSOL® 30N25, 30N12, 30H25, and 20H12, available from Clariant Corp.

In addition to the small abrasive particles, the slurry of this invention includes large abrasive particles having a mean particle size between 2 and 10 times larger than the mean particle size of the small abrasive particles. Preferably, the large abrasive particles have a mean particle size of between 30 and 100 nm. The large abrasive particles can be selected from abrasives previously described. Preferably, the large abrasive particles are silica particles. In the slurry of this invention, the volume ratio of small abrasive particles to large abrasive particles is between 5:1 and 100:1, more preferably between 5:1 and 20:1. In one preferred embodiment of this invention, the ratio of small abrasive particles to large abrasive particles is about 10:1. The small and large abrasive particles used in the slurry exhibit at least a bimodal particle size distribution with separate modes corresponding to the small abrasive particles and the large abrasive particles respectively. Additional slurry particles can also be added to produce particle size distributions having more than two modes, if desired, according to the specific use of the slurry of this invention.

In addition to the abrasive particles, the slurry of the invention can contain viscosity additives. For example, a thickening agent can be added to increase the viscosity of the slurry. One particularly preferred class of thickening agents is the CARBOPOL® thickening agents available from BF Goodrich Co. which upon addition to water form a gel. Alternatively, deionized water can be added to decrease the viscosity of the slurry. Preferably, the viscosity of the slurry is between about 50 and 500 centipoise, more preferably about 150 centipoise.

The slurry of this invention can further include etchants. Preferably, the etchants used in the invention are non-metallic etchants. Exemplary etchants include sodium salts, potassium salts, ammonium salts, quaternary ammonium salts, peroxides, chlorates, perchlorates, permanganates, persulfates, and mixtures thereof. Particularly useful etchants for use in the invention include KOH, $NH_4OH$, $H_2O_2$, $H_3PO_4$, HOCl, KOCl, $KMnO_4$, $CH_3COOH$, and mixtures thereof. More preferably, the etchant is KOH, $NH_4OH$, or a mixture thereof.

It has been discovered that high selectivity based on the topography of the integrated circuit structure 10 produces a planar surface 26 without under-polishing or over-polishing of the integrated circuit structure. Specifically, the CMP slurries of this invention effectively planarize raised structures but polish planar structures at a considerably slower rate to prevent over-polishing of these structures. In particular, the CMP slurries polish local oxide patterns at a rate of between 1500 and 6000 Å/min which is comparable to the polishing rate for conventional slurries. Nevertheless, the slurries of the invention polish planar oxide surfaces at a rate of between 300 and 1000 Å/min compared to 1500–3000 Å/min for conventional slurries. Therefore, as local patterns are polished, the areas which have already been planarized are polished at a much slower rate and the local patterns can be planarized without over-polishing the integrated circuit structure 10. As a result, the slurries of the invention have a large range of effective polishing times wherein CMP can occur without under-polishing or over-polishing. Moreover, the resulting polished integrated circuit structure 10 has a stop layer 16 which has a substantially uniform thickness across the surface of the structure 10. Therefore, the performance of the integrated circuit is maximized and highly intricate designs can be used with integrated circuits when polished with the slurries of this invention.

The present invention has been described with respect to the polishing of silicon dioxide to produce transistor devices but can be used to polish other materials to produce integrated circuit devices. It is understood that upon reading the above description of the present invention and studying the accompanying drawings, one skilled in the art could make changes in the spirit and scope of the following appended claims.

What is claimed is:

1. A chemical mechanical polishing slurry for polishing integrated circuit structures comprising:

an aqueous liquid carrier;

small abrasive particles having a mean diameter in a range from about 2 nm to about 30 nm; and large abrasive particles having a mean diameter in a range from about two times larger to about ten times larger than the mean diameter of the small abrasive particles; wherein the volume ratio of small abrasive particles to large abrasive particles is in a range from about 5:1 to about 100:1.

2. The chemical mechanical polishing slurry according to claim 1 wherein said large abrasive particles have a mean particle diameter of between 30 and 100 nm.

3. The chemical mechanical polishing slurry according to claim 1 wherein the small abrasive particles are selected from the group consisting of silica, alumina, titania, ceria, germania, diamond and silicon carbide.

4. The chemical mechanical polishing slurry according to claim 1 wherein the small abrasive particles are silica particles.

5. The chemical mechanical polishing slurry according to claim 1 wherein the large abrasive particles are selected from the group consisting of silica, alumina, titania, ceria, germania, diamond and silicon carbide.

6. The chemical mechanical polishing slurry according to claim 1 wherein the large abrasive particles are silica particles.

7. The chemical mechanical polishing slurry according to claim 1 wherein said slurry has a viscosity of between about 50 and 500 centipoise.

8. The chemical mechanical polishing slurry according to claim 1 further comprising a thickening agent.

9. The chemical mechanical polishing slurry according to claim 1 further comprising at least one etchant selected from the group consisting of KOH and $NH_4OH$.

* * * * *